(12) United States Patent
Dias

(10) Patent No.: US 9,312,875 B1
(45) Date of Patent: Apr. 12, 2016

(54) SIGNAL PROCESSING APPARATUS AND METHOD FOR PROCESSING A SIGNAL

(71) Applicant: Intel IP Corporation, Santa Clara, CA (US)

(72) Inventor: Victor Da Fonte Dias, Neubiberg (DE)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 14/751,195

(22) Filed: Jun. 26, 2015

(51) Int. Cl.
*H03M 1/00* (2006.01)
*H03M 1/12* (2006.01)
*H03M 1/08* (2006.01)

(52) U.S. Cl.
CPC ............. *H03M 1/1245* (2013.01); *H03M 1/08* (2013.01); *H03M 1/00* (2013.01); *H03M 1/12* (2013.01)

(58) Field of Classification Search
CPC .................................. H03M 1/00; H03M 1/12
USPC .................. 341/122, 120, 118, 119, 155, 123
See application file for complete search history.

(56) References Cited

U.S. PATENT DOCUMENTS 8,581,768 B1 * 11/2013 Pagnanelli ..................... 341/143

* cited by examiner

*Primary Examiner* — Joseph Lauture

(57) ABSTRACT

A signal processing apparatus is described comprising a sampling time control circuit configured to provide a sequence of digital values, each digital value specifying a sampling time of a sequence of sampling times, a sampling circuit configured to sample an input signal according to the sequence of sampling times to generate a sampling value of the input signal for each sampling time of the sequence of sampling times and a processing circuit configured to receive the sampling values and configured to process the sampling values based on the sampling times, wherein the sampling time control circuit is configured to introduce jitter into the sampling times, by varying the time intervals between adjacent sampling times.

20 Claims, 6 Drawing Sheets

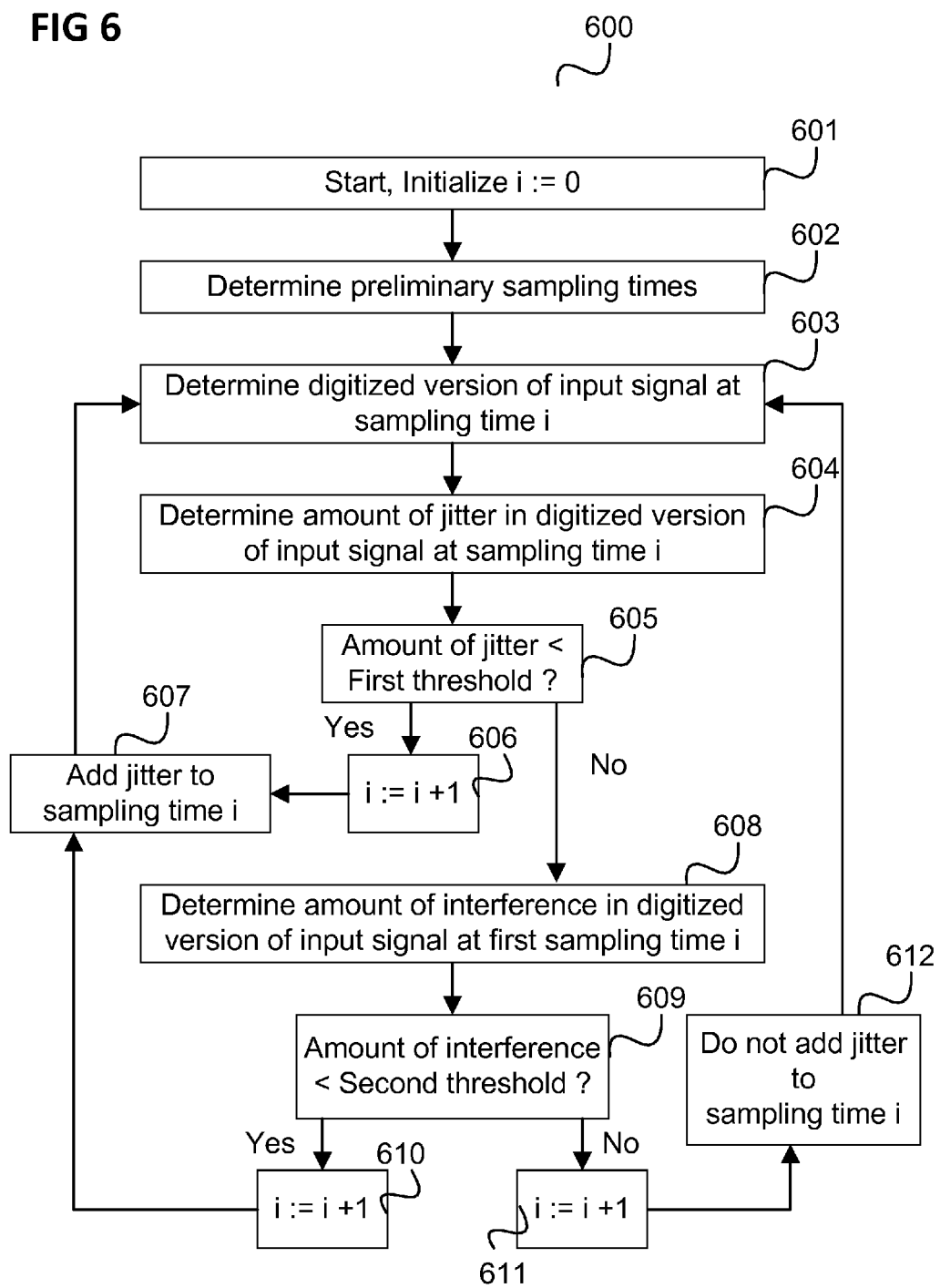

SIGNAL PROCESSING APPARATUS AND METHOD FOR PROCESSING A SIGNAL

TECHNICAL FIELD

Embodiments described herein generally relate to signal processing apparatuses and methods for processing a signal.

BACKGROUND

The conversion of an analog signal to the digital domain, i.e. analog-to-digital conversion is a typical application in, e.g., communication systems. An analog signal is typically sampled at a certain frequency to generate sampling values at a regular time grid which may then be further processed, e.g. by a discrete Fourier transformation. However, the sampling values may be disturbed by noise and interference which complicates the further processing. Accordingly, approaches to enhance the quality of the sampling values are desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 6 shows a flow diagram illustrating how the sampling time control circuit carries out the determination of the sequence of sampling times.

DESCRIPTION OF EMBODIMENTS

Figure 1:
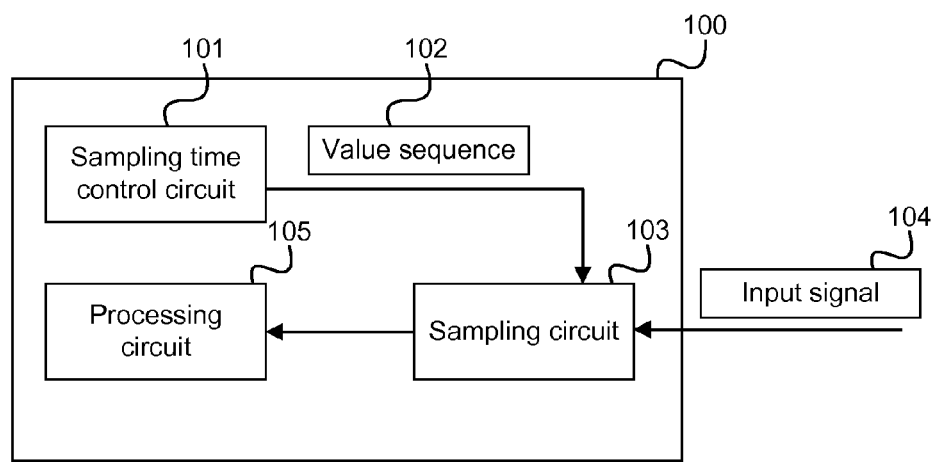
FIG. 1 shows a signal processing apparatus.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Signals can be processed in a variety of domains, the variety of which spans the possibilities of continuous vs. discrete nature of the time and amplitude axis. For instance, signals can be entirely processed in:

- the continuous-time and continuous-amplitude domain, which in engineering parlance is commonly referred to as analog domain.
- the discrete-time and continuous-amplitude domain, which is commonly referred to as sampled-data domain. Here implementation techniques like switched-capacitor, switched-current, charge-coupled device and other techniques are typically applied.
- the discrete-time and discrete-amplitude domain, widely known as digital domain.

A fourth combination is conceivable, as well as other pseudo-domains like sigma-delta domain, which can however be considered to be of minor importance for the following description.

Signals in these domains can be represented in time as well as in frequency spaces, connected by a pair of Fourier transforms. In this context concepts like aliasing, imaging, Nyquist rate, etc. arise.

A signal may be transformed between the above-mentioned domains by interface blocks such as a sampler (which discretizes time), a quantizer (which discretizes amplitude), a hold circuit (which creates a continuous-time signal from a discrete-time signal), an analog filter (which creates or interpolates a discrete-amplitude signal to create a continuous-amplitude signal), etc. All of these interface blocks may be implementable in many varieties, and all correspond to specific and well defined signal transformations in time as well as in frequency spaces.

Further, a signal may be processed by an interpolator or a decimator in the time-discrete domain, both in case of discrete amplitude or continuous amplitude. For instance, a discrete-time interpolator creates, first, an additional set of discrete-points in time in between the available ones, i.e. increases the rate. A discrete-time decimator eliminates values of a time-discrete representation of a signal, i.e. decreases the rate. Rate reducers preceded by an adequate antialiasing filter constitute a decimator, while rate increasers followed by an image-elimination or smoothing filter constitute an interpolator.

Typically, a sampling circuit and a hold circuit are operated with fixed frequencies, i.e. they are assumed to discretize a continuous-time signal or to generate a continuous-time signal at well defined and constant time intervals. By doing so the mathematics of, for example, a subsequent transformation is typically quite straightforward. Further, when not using constant time intervals, the signal is distorted or more generally noise is added to the signal.

A variation of the time intervals typically leads to jitter which adds noise to the sampled signal (for analog-to-digital conversion, ADC) or to the reproduced signal (for digital-to-analog conversion, DAC). However, noise is typically only relevant if it shares the same frequency band as the signal to be processed, or, in the time domain, if its amplitude and position in time are unknown. If known, errors can be post-subtracted or pre-corrected, and in particular if exact time is known an estimation procedure can be applied to clean the signal from noise.

In the following, a signal processing apparatus is described that may for example be used to deliberately introduce jitter via the sampling times, e.g. with the purpose to avoid aliasing effects, wherein the noise introduced with the jitter may then be removed based on the knowledge of the sampling times. In other words, various aspects of this disclosure may alter the deliberate introduction of jitter in response to a measured signal quality (e.g. of the digitized signal).

FIG. 1 shows a signal processing apparatus 100.

The signal processing apparatus 100 includes a sampling time control circuit 101 configured to provide a sequence of digital values 102, each digital value specifying a sampling time of a sequence of sampling times.

The signal processing apparatus 100 further includes a sampling circuit 103 configured to sample an input signal 104 according to the sequence of sampling times to generate a sampling value of the input signal 104 for each sampling time of the sequence of sampling times.

Further, the signal processing apparatus 100 includes a processing circuit 105 configured to receive the sampling values and configured to process the sampling values based on the sampling times. The sampling time control circuit is configured to introduce jitter into the sampling times, by varying the time intervals between adjacent sampling times.

In other words, for example, a sampling time control circuit specifies sampling times individually and a processing circuit processing the sampled signal values takes into account the sampling times. This allows to freely chose the sampling times (e.g. with certain variations from a predetermined sampling grid), for example allowing to spread interference.

In other words, the signal processing apparatus allows providing an interface between the continuous-time domain and the digital processing domain based on a possibly variable positioning of the time instants of sampling (in the ADC direction) and, for example, similarly, of holding (in the DAC direction).

The processing circuit 105 processing the sampling values based on the sampling times may include that the processing circuit 105 takes the sampling times into account when processing the sampling times, e.g. takes into account that the sampling times differ from a predetermined grid and, e.g., how much the sampling times differ from the predetermined grid. By interpolation and/or extrapolation, the processing circuit 105 may for example generate sampling values at the points in time of the predetermined grid from the sampling values provided by the sampling circuit 103.

The components of the signal processing apparatus (e.g. the sampling time control circuit, the sampling circuit and the processing circuit) may for example be implemented by one or more circuits. A "circuit" may be understood as any kind of a logic implementing entity, which may be special purpose circuitry or a processor executing software stored in a memory, firmware, or any combination thereof. Thus a "circuit" may be a hard-wired logic circuit or a programmable logic circuit such as a programmable processor, e.g. a microprocessor. A "circuit" may also be a processor executing software, e.g. any kind of computer program. Any other kind of implementation of the respective functions which will be described in more detail below may also be understood as a "circuit".

It should further be noted that the sampling time control circuit 101 and the processing circuit 105 may be implemented by the same circuit, e.g. a processor such as a DSP (digital signal processor).

Figure 2:
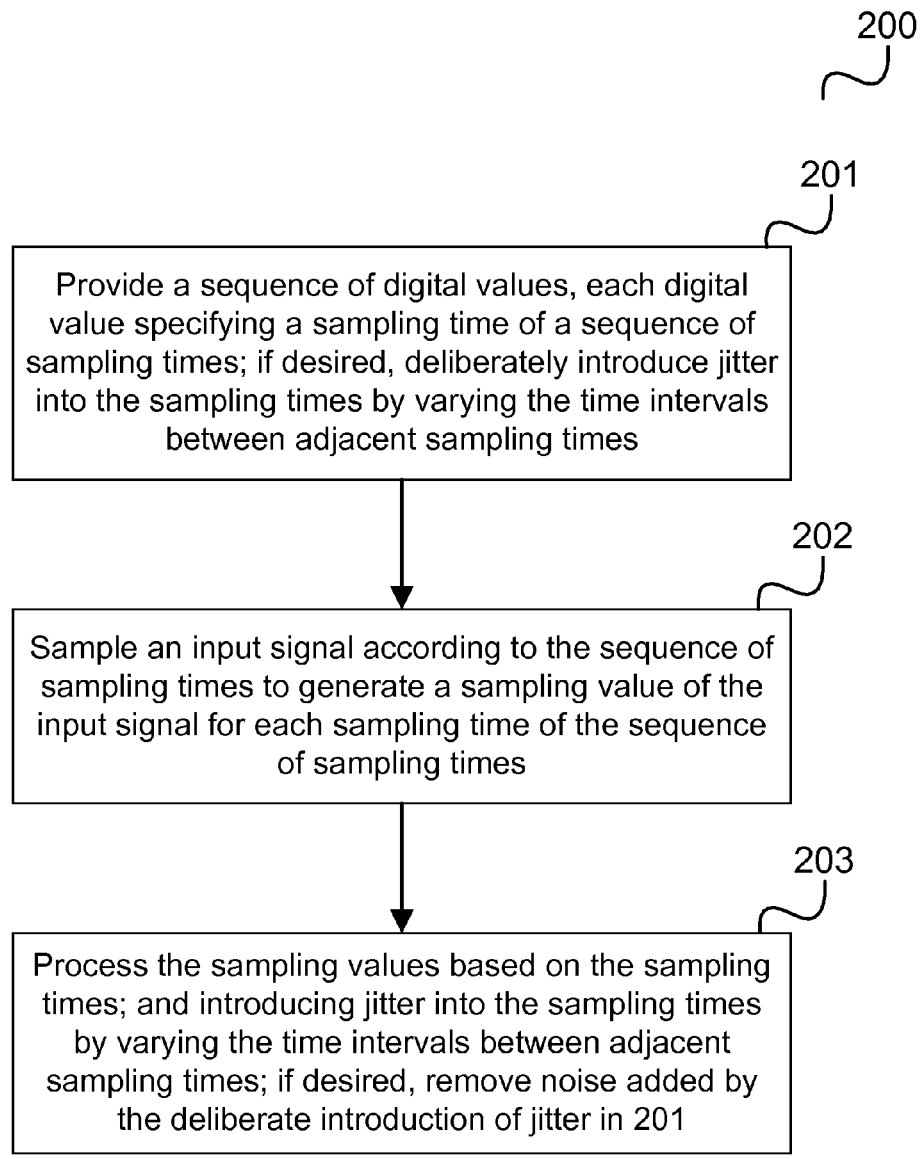
FIG. 2 shows a flow diagram illustrating a method for processing a signal.

The signal processing apparatus 100 for example carries out a method as illustrated in FIG. 2.

FIG. 2 shows a flow diagram 200 illustrating a method for processing a signal, for example performed by a signal processing apparatus.

In 201, the signal processing apparatus provides a sequence of digital values, each digital value specifying a sampling time of a sequence of sampling times. If desired and in 201, the signal processing apparatus may be used to deliberately introduce jitter via the sampling times, e.g. with the purpose to avoid aliasing effects, wherein the noise introduced with the jitter may then be removed based on the knowledge of the sampling times. In other words, various aspects of this disclosure may alter the deliberate introduction of jitter in response to a measured signal quality (e.g. of the digitized signal).

In 202, the signal processing apparatus samples an input signal according to the sequence of sampling times to generate a sampling value of the input signal for each sampling time of the sequence of sampling times.

In 203, the signal processing apparatus processes the sampling values based on the sampling times. If desired and in 203, the signal processing may remove the noise introduced with the deliberately introduced jitter in 201, based on the knowledge of the sampling times.

The following examples pertain to further embodiments.

In the following, examples will be described in more detail.

Figure 3:
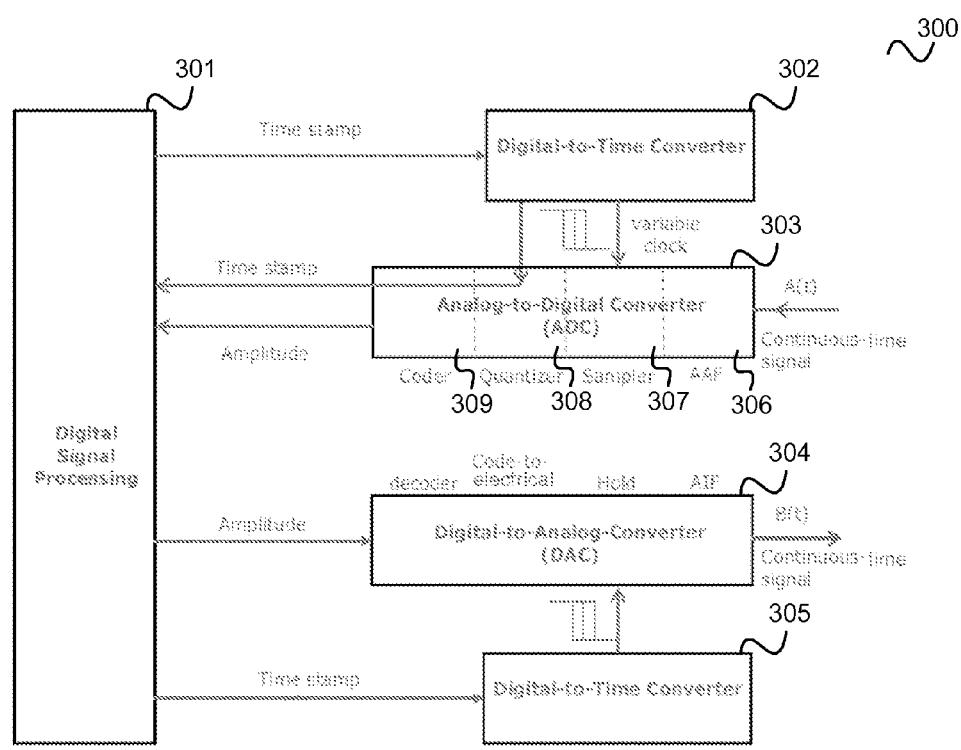
FIG. 3 shows a signal processing apparatus.

FIG. 3 shows a signal processing apparatus 300.

The signal processing circuit 300 includes a digital signal processor (DSP) 301, a first digital-to-time converter (DTC) 302, an analog-to-digital converter (ADC) 303, digital-to-analog-converter (DAC) 304 and a second digital-to-time converter (DTC) 305.

Each of the DTCs 302, 305 is a functional block that places the edges of a square waveform (in general a periodic waveform) in a point in time according to a digital code. The positioning of the edges is for example done with respect to a predetermined underlying grid of fixed and equally spaced time-discrete points. The edges are placed one-by-one and independently from each other at points in time slightly after of slightly before the grid.

In this example, the signal processing apparatus receives an analog signal A(t), i.e. a time-continuous signal.

The signal enters the Analog-to-Digital Converter (ADC) 303, which processes the signal A(t) by an anti-alias filter (AAF) 306, a sampler (for time-discretization) 307, a quantizer (for amplitude discretization) 308, and a coder 309. The coder 309 allocates a digital code to each quantized level, i.e. to each quantized sampled anti-alias-filtered amplitude value of the signal A(t). The coder 309 may include a filter, a decimator, etc.

The first Digital-to-Time-Converter 302 triggers the sampler 307 at the desired sampling time instants. The desired sampling time instants are determined in the DSP 301. The first Digital-to-Time-Converter 302 receives, for each sampling time, a code from the DSP 301 which specifies the desired time instant for sampling (e.g. in form of a time stamp). The first Digital-to-Time-Converter 302 generates a square waveform with edges according to the specified sampling times and triggers the sampler 307 accordingly.

The ADC 303 provides the DSP 301 with the result of the sampling (after quantization and coding), i.e., for each sampling time with a value (e.g. represented by one byte) specifying to the quantized sampled amplitude. Further, in this example, the ADC 303 provides, for each sampling time, a value (e.g. represented by one byte) specifying the sampling time (i.e. a time stamp of the quantized sampled amplitude). However, the DSP 301 may also be configured to be able to align quantized sampled amplitudes with the corresponding sampling times (and generate timestamps for the quantized sampled amplitudes itself). In that case, the ACD 303 does not need to return timestamps to the DSP 301.

The DSP 301 may operate based on a fixed time grid (or multiple or sub-multiples of it, but strictly periodic), the interface between the DSP 301 and the first DTC 302 may also rely on a fixed time grid and the interface between the ADC 303 and the DSP 301 may also rely a fixed time grid. The interface between the first DTC 302 and the ADC 303 is a time variable grid (however, the time stamps are for example coded with reference to a fixed time grid, e.g. by means of offsets).

To allow the DSP 301 to work on a fixed time grid for processing the digital signal provided by the ADC 303, the DSP 301 may for example interpolate or extrapolate the amplitude values to arrive at amplitude values for a fixed time grid. The DSP 301 could then for example apply a discrete Fourier transformation or a similar processing.

The DSP 301 is capable of jointly processing amplitude stamps together with timestamps. For example, the DSP 301 can generate time stamps according to a given pattern e.g. sinusoidal, two alternating levels, pseudo-random, etc—and supply it to the first DTC 302 for generation and sampling in the ADC 303. Since the DSP 301 knows what time stamp to apply to each amplitude sample, it can apply filtering for extrapolation, or derivatives, or any other suitable algorithm to correct the measurement (i.e. to arrive at amplitude values at a fixed time grid). By varying the sampling times, the DSP 301 can jitter (in other words dither) the sampling by the sampler 307, which may for example allow the DSP 301 to spread the power of an interference signal placed in the aliasing bands of the input signal.

Figure 4:
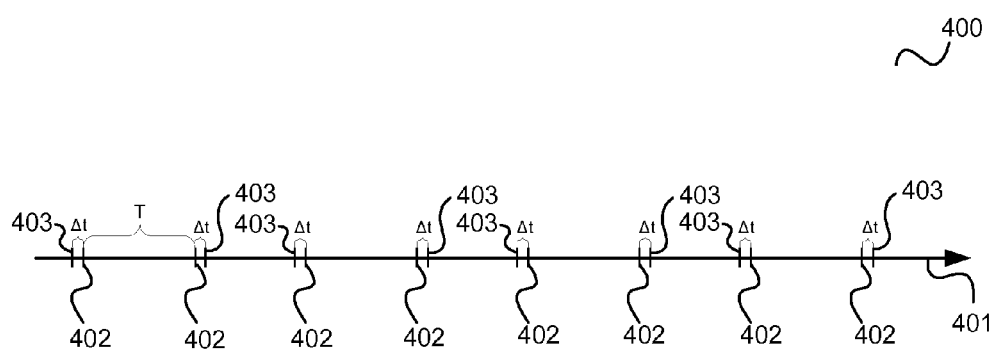
FIG. 4 shows a diagram illustrating an example for sampling times.

FIG. 4 shows a diagram 400 illustrating an example for sampling times determined by the DSP 301 and supplied to the first DTC 302 using time stamps.

The sampling times are given along a time axis 401. In this example, the DSP 301 specifies the sampling times with respect to a predetermined grid (in other words a predetermined pattern) of points in time. In this example, the DSP 301 has determined sampling times 403 which differ from the points in time 402 by a certain time offset Δt in an alternating fashion. This means that the first sampling time differs from the first point in time of the predetermined grid by −Δt, the second sampling time differs from the second point in time of the predetermined grid by +Δt, the third sampling time differs from the third point in time of the predetermined grid by −Δt and so on.

Other patterns may be used and the differences between the sampling times and the points in time of the predetermined grid may also be randomized (for example, it may be randomly determined whether a sampling time differs from a point in time of the predetermined grid by +Δt or −Δt.

The period length T of the predetermined grid is for example 1 ms and Δt is for example 10 ns.

If, for example, the input signal corresponds to a received radio signal the variation of sampling times may be used by the DSP 301 to spread the power of an interference signal (e.g. having a narrow spectrum in an aliasing band of the input signal) over a larger spectrum.

The DSP 301, the first TDC 302 and the ADC 303 could be part of a closed (control) loop running a minimization algorithm or in general an algorithm with a cost function (e.g. with respect to interference to minimize interference by varying the sampling times, e.g. by varying the a in FIG. 4). Thus, the DSP 301 may for example trade-off jitter introduced with the variation of the sampling times from a predetermined grid versus reduction of interference achieved with the variation of the sampling times from the predetermined grid.

The DAC 304 may for example include a decoder, a code to electrical variable converter, a hold circuit and an anti-imaging or smoothing filter (AIF). For sending out an analog output signal B(t), the DSP 301 sends time-stamps of amplitude values to the second DTC 305, and the amplitude values to the DAC 304. The DSP 301 can in this case apply any suitable algorithm to generate time-stamps to meet a desired processing target. Regarding DSP processing possibilities, the DAC path can be seen to be inherently constrained by its open-loop nature.

Figure 5:
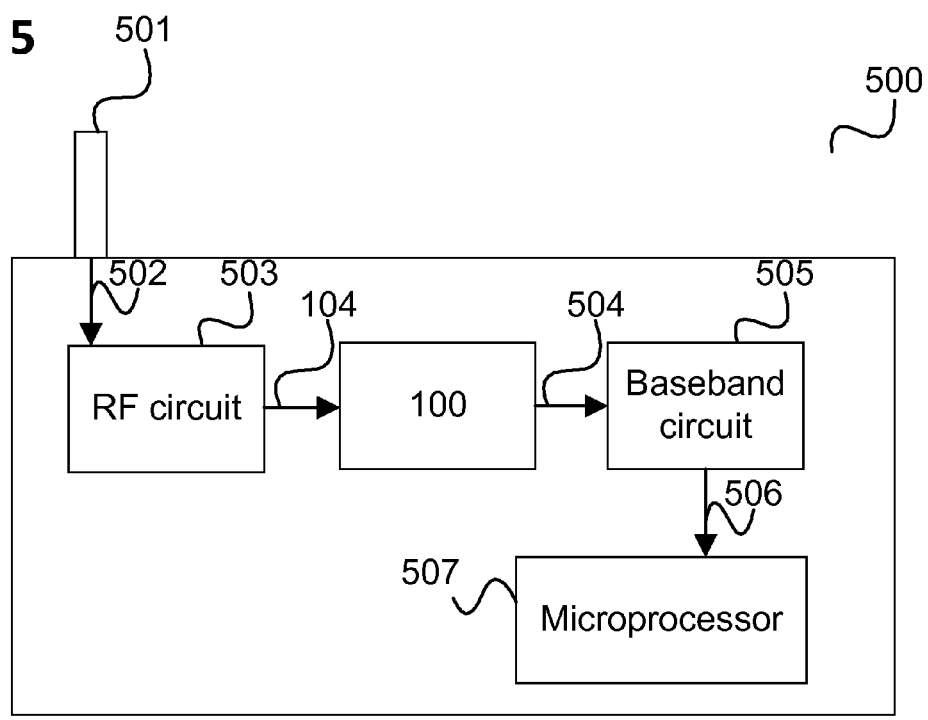
FIG. 5 shows a device including the signal processing apparatus.

FIG. 5 shows a device 500 including the signal processing apparatus 100 of FIG. 1.

The device 500 may be a radio communication device such as a radio communication terminal device (such as e.g. a User Equipment (UE)) or a radio base station (such as e.g. a NodeB or an eNodeB). The device 500 may include an antenna 501 and a radio frequency (RF) circuit 503 coupled to the antenna 501. A radio signal 502 received by the antenna 501 may be applied to the RF circuit 503. The RF circuit 503 may process the radio signal 502 in accordance to one or more radio communication technologies implemented in the RF circuit 503 (such as e.g. Long Term Evolution (LTE) and/or Long Term Evolution Advanced (LTE-A), or any other type of 3G or 4G radio communication technology). The RF circuit 503 may include one or more circuits e.g. implementing filtering, impedance matching, signal amplification, frequency conversion (e.g. using a local oscillator signal), and the like. By way of example, the radio signal 502 is an analog signal and the signal processing in the RF circuit 503 may be carried out in the analog signal domain. In the example shown, an output signal of the RF circuit 503 may be an analog signal and may correspond to the input signal 104 of FIG. 1. The signal processing apparatus 100 may process the analog input signal 104 as described above and may convert the analog input signal 104 into a digitized signal 504. The signal processing apparatus 100 may provide the digitized signal 504 to a baseband circuit 505 which may completely operate in the digital signal domain. The baseband circuit 505 may include one or more circuits e.g. implementing filtering, signal amplification, and other baseband functions as desired. The baseband circuit 505 may output a processed baseband signal 506 to one or more microprocessors 507 for further processing such as channel decoding and the like.

However, it should be noted that the analog-to-digital conversion and thus the signal processing apparatus 100 of FIG. 1 may be provided within the RF circuit 503 so that some parts of the RF circuit 503 may operate in the analog signal domain, whereas some other parts of the RF circuit 503 may operate in the digital signal domain.

FIG. 6 shows a flow diagram 600 illustrating how the sampling time control circuit 101 carries out the determination of the sequence of sampling times.

As described above, the sampling time control circuit 101 may determine the sampling times based on a quality measure of the digitized version of the input signal. By way of example, the sampling time control circuit 101 may be configured to carry out a process as shown in the flow diagram 600 to determine the sampling times. After starting the process and initializing an index i to a value "0" in 601, the sampling time control circuit 101 may determine preliminary sampling times which may correspond to a (e.g. regular) grid of predefined sampling times, which may be stored in a memory of the device. The preliminary sampling time i may be changed by a small offset (e.g. the offset ±ΔT as described above) or may remain unamended during the process. In other words, as will be described in more detail below, the sampling time control circuit 101 may add jitter to a sampling time i (e.g. a positive or negative time offset) or not. To do this, the process provides in 603 determining a digitized version of the input signal 104 at the respective sampling time i. Then, in 604, the process determines an amount of jitter which is present in the digitized version of the input signal 104 at the respective sampling time i, followed by comparing the determined amount of jitter with a predefined first threshold value (in 605). In case the determined amount of jitter is smaller than the predefined first threshold value ("Yes" in 605), the process increases the time index i by a predefined value, e.g. by the value "1" and continues in 607 by adding jitter to the sampling time of the new time index i. The process then may continue in 603 and the process will be repeated from there. However, in case the determined amount of jitter is not smaller than the predefined first threshold value ("No" in 605), the process may continue by determining an amount of interference in the digitized version of the input signal 104 at the respective sampling time i (in 608), followed by comparing the determined amount of interference with a predefined second threshold value, which may be different from the first threshold value (in 609). In case the determined amount of interference is smaller than the predefined second threshold value ("Yes" in 609), the process increases the time index i by a predefined value, e.g. by the value "1" and continues in 607 by adding jitter to the sampling time of the new time index i. The process then may continue in 603 and the process will be repeated from there. However, in case the determined amount of interference is not smaller than the predefined second threshold value ("No" in 609), the process may increase the time index i by a predefined value, e.g. by the value "1" and may continue in 612 by not adding jitter to the sampling time i. In other words, in this case, the respective sampling time i remains unamended. The process then may continue in 603 and the process will be repeated from there.

It is to be noted that in alternative aspects, the process may omit 604, 605, and 606. In other words, in this process, only the amount of interference of the digitized version of the input signal may be measured and the alteration of the addition of the jitter to the respective sampling time may only be based on the measured amount of interference.

Furthermore, in alternative aspects, the process may omit 608, 609, and 610. In other words, in this process, only the amount of jitter of the digitized version of the input signal may be measured and the alteration of the addition of the jitter to the respective sampling time may only be based on the measured amount of interference.

Example 1 is a signal processing apparatus as illustrated in FIG. 1.

In Example 2, the subject matter of Example 1 may optionally include that the sampling time control circuit is configured to provide a plurality of digital values, wherein each digital value specifies an offset with respect to a respective sampling time of a predetermined grid of a plurality of points in time.

In Example 3, the subject matter of Example 2 may optionally include that the sampling time control circuit is configured to provide the predetermined grid of the plurality of points in time as a periodic sequence of a plurality of points in time.

In Example 4, the subject matter of any one of Examples 2-3 may optionally include that the processing circuit is configured to generate further sampling values at the points in time of the predetermined grid of points in time by interpolation, extrapolation or both of the sampling values.

In Example 5, the subject matter of any one of Examples 1-4 may optionally include that the sampling time control circuit is configured to provide the sampling values as sampling values of the amplitude of the input signal.

In Example 6, the subject matter of any one of Examples 1-5 may optionally include that the sampling time control circuit is configured to determine the sequence of sampling times.

In Example 7, the subject matter of Example 6 may optionally include that the sampling time control circuit is configured to determine the sequence of sampling times by varying the time intervals between adjacent sampling times based on a quality measure of the sampling values.

In Example 8, the subject matter of any one of Examples 6-7 may optionally include that the processing circuit is configured to generate a digitized version of the input signal based on the sampling values and that the sampling time control circuit is configured to determine the sequence of sampling times based on a quality measure of the digitized version of the input signal.

In Example 9, the subject matter of Example 8 may optionally include that the sampling time control circuit is configured to provide the quality measure based on an amount of jitter in the digitized version of the input signal.

In Example 10, the subject matter of any one of Examples 8-9 may optionally include that the sampling time control circuit is configured to provide the quality measure based on an amount of interference in the digitized version of the input signal.

In Example 11, the subject matter of any one of Examples 8-10 may optionally include that the processing circuit is configured to reconstruct transmission data from the digitized version of the input signal.

In Example 12, the subject matter of Example 11 may optionally include that the sampling time control circuit is configured to receive the input signal comprising a modulated carrier signal representing the transmission data.

In Example 13, the subject matter of any one of Examples 1-12 may optionally include that the sampling time control unit is configured to vary a time interval between two subsequent sampling times of the sequence of sampling times over the sequence of sampling times.

In Example 14, the subject matter of Example 13 may optionally include that the processing circuit is configured to remove jitter from the sampling values introduced by the variation of the time interval between two subsequent sampling times of the sequence of sampling times.

Example 15 is a method for processing a signal as illustrated in FIG. 2.

In Example 16, the subject matter of Example 15 may optionally include that each digital value specifies an offset with respect to a respective sampling time of a predetermined grid of a plurality of points in time.

In Example 17, the subject matter of Example 16 may optionally include that the predetermined grid of a plurality of sampling points in time is a periodic sequence of the plurality of points in time.

In Example 18, the subject matter of any one of Examples 16-17 may optionally include generating further sampling values at the points in time of the predetermined grid of points in time by interpolation, extrapolation or both of the sampling values.

In Example 19, the subject matter of any one of Examples 15-18 may optionally include that the sampling values are sampling values of the amplitude of the input signal.

In Example 20, the subject matter of any one of Examples 15-19 may optionally include determining the sequence of sampling times.

In Example 21, the subject matter of Example 20 may optionally include determining the sequence of sampling times by varying the time intervals between adjacent sampling times based on a quality measure of the sampling values.

In Example 22, the subject matter of any one of Examples 20-21 may optionally include generating a digitized version of the input signal based on the sampling values and determining the sequence of sampling times based on a quality measure of the digitized version of the input signal.

In Example 23, the subject matter of Example 22 may optionally include that the quality measure is based on an amount of jitter in the digitized version of the input signal.

In Example 24, the subject matter of any one of Examples 22-23 may optionally include that the quality measure is based on an amount of interference in the digitized version of the input signal.

In Example 25, the subject matter of any one of Examples 22-24 may optionally include reconstructing transmission data from the digitized version of the input signal.

In Example 26, the subject matter of Example 25 may optionally include that the input signal comprises a modulated carrier signal representing the transmission data.

In Example 27, the subject matter of any one of Examples 15-26 may optionally include varying a time interval between two subsequent sampling times of the sequence of sampling times over the sequence of sampling times.

In Example 28, the subject matter of Example 27 may optionally include removing jitter from the sampling values introduced by the variation of the time interval between two subsequent sampling times of the sequence of sampling times.

Example 29 is a computer readable medium having recorded instructions thereon which, when executed by a processor, make the processor perform a method for processing a signal according to any one of Examples 15 to 28.

Example 30 is a signal processing apparatus comprising a sampling time control means for providing a sequence of digital values, each digital value specifying a sampling time of a sequence of sampling times, a sampling means for sampling an input signal according to the sequence of sampling times to generate a sampling value of the input signal for each sampling time of the sequence of sampling times and a processing means for receiving the sampling values and for processing the sampling values based on the sampling times, wherein the sampling time control means is configured to introduce jitter into the sampling times, by varying the time intervals between adjacent sampling times.

In Example 31, the subject matter of Example 30 may optionally include that the sampling time control means is configured to provide a plurality of digital values, each digital value specifying an offset with respect to a respective sampling time of a predetermined grid of a plurality of points in time.

In Example 32, the subject matter of Example 31 may optionally include that the sampling time control means is configured to provide the predetermined grid of sampling points in time as a periodic sequence of points in time.

In Example 33, the subject matter of any one of Examples 31-32 may optionally include that the processing means is configured to generate further sampling values at the points in time of the predetermined grid of points in time by interpolation, extrapolation or both of the sampling values.

In Example 34, the subject matter of any one of Examples 30-33 may optionally include that the sampling time control means is configured to provide the sampling values as sampling values of the amplitude of the input signal.

In Example 35, the subject matter of any one of Examples 30-34 may optionally include that the sampling time control is configured to determine the sequence of sampling times.

In Example 36, the subject matter of Example 35 may optionally include that the sampling time control means configured to determine the sequence of sampling times based on a quality measure of the sampling values.

In Example 37, the subject matter of any one of Examples 35-36 may optionally include that the processing means is configured to generate a digitized version of the input signal based on the sampling values and the sampling time control means is configured to determine the sequence of sampling times based on a quality measure of the digitized version of the input signal.

In Example 38, the subject matter of Example 37 may optionally include that the sampling time control means is configured to provide the quality measure based on an amount of jitter in the digitized version of the input signal.

In Example 39, the subject matter of any one of Examples 37-38 may optionally include that the sampling time control means is configured to provide the quality measure based on an amount of interference in the digitized version of the input signal.

In Example 40, the subject matter of any one of Examples 37-39 may optionally include that the processing means is configured to reconstruct transmission data from the digitized version of the input signal.

In Example 41, the subject matter of Example 40 may optionally include that the sampling means is configured to receive the input signal comprising a modulated carrier signal representing the transmission data.

In Example 42, the subject matter of any one of Examples 30-41 may optionally include that the sampling time control unit is configured to vary a time interval between two subsequent sampling times of the sequence of sampling times over the sequence of sampling times.

In Example 43, the subject matter of Example 42 may optionally include that the processing means is configured to remove jitter from the sampling values introduced by the variation of the time interval between two subsequent sampling times of the sequence of sampling times.

It should be noted that one or more of the features of any of the examples above may be combined with any one of the other examples.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

The invention claimed is:

1. A signal processing apparatus comprising
   a sampling time control circuit configured to provide a sequence of digital values, each digital value specifying a sampling time of a sequence of sampling times;
   a sampling circuit configured to sample an input signal according to the sequence of sampling times to generate a sampling value of the input signal for each sampling time of the sequence of sampling times;
   a processing circuit configured to receive the sampling values and configured to process the sampling values based on the sampling times, wherein the sampling time control circuit is configured to introduce jitter into the sampling times, by varying the time intervals between adjacent sampling times.

2. The signal processing apparatus of claim 1, wherein the sampling time control circuit is configured to provide a plurality of digital values, wherein each digital value specifies an offset with respect to a respective sampling time of a predetermined grid of a plurality of points in time.

3. The signal processing apparatus of claim 2, wherein the processing circuit is configured to generate further sampling values at the points in time of the predetermined grid of points in time by interpolation, extrapolation or both of the sampling values.

4. The signal processing apparatus of claim 1, wherein the sampling time control circuit is configured to provide the sampling values as sampling values of the amplitude of the input signal.

5. The signal processing apparatus of claim 1, wherein the sampling time control circuit is configured to determine the sequence of sampling times.

6. The signal processing apparatus of claim 5, wherein the sampling time control circuit is configured to determine the sequence of sampling times by varying the time intervals between adjacent sampling times based on a quality measure of the sampling values.

7. The signal processing apparatus of claim 5, wherein the processing circuit is configured to generate a digitized version of the input signal based on the sampling values and the sampling time control circuit is configured to determine the sequence of sampling times based on a quality measure of the digitized version of the input signal.

8. The signal processing apparatus of claim 7, wherein the sampling time control circuit is configured to provide the quality measure based on an amount of jitter in the digitized version of the input signal.

9. The signal processing apparatus of claim 7, wherein the sampling time control circuit is configured to provide the quality measure based on an amount of interference in the digitized version of the input signal.

10. The signal processing apparatus of claim 7, wherein the processing circuit is configured to reconstruct transmission data from the digitized version of the input signal.

11. A method for processing a signal comprising
providing a sequence of digital values, each digital value specifying a sampling time of a sequence of sampling times;
sampling an input signal according to the sequence of sampling times to generate a sampling value of the input signal for each sampling time of the sequence of sampling times;
processing the sampling values based on the sampling times, and introducing jitter into the sampling times by varying the time intervals between adjacent sampling times.

12. The method of claim 11, wherein each digital value specifies an offset with respect to a respective sampling time of a predetermined grid of a plurality of points in time.

13. The method of claim 11, comprising determining the sequence of sampling times.

14. The method of claim 13, comprising determining the sequence of sampling times by varying the time intervals between adjacent sampling times based on a quality measure of the sampling values.

15. The method of claim 13, comprising generating a digitized version of the input signal based on the sampling values and determining the sequence of sampling times based on a quality measure of the digitized version of the input signal.

16. The method of claim 15, wherein the quality measure is based on an amount of jitter in the digitized version of the input signal.

17. The method of claim 15, wherein the quality measure is based on an amount of interference in the digitized version of the input signal.

18. A signal processing apparatus comprising
a sampling time control means for providing a sequence of digital values, each digital value specifying a sampling time of a sequence of sampling times;
a sampling means for sampling an input signal according to the sequence of sampling times to generate a sampling value of the input signal for each sampling time of the sequence of sampling times;
a processing means for receiving the sampling values and for processing the sampling values based on the sampling times wherein the sampling time control means is configured to introduce jitter into the sampling times, by varying the time intervals between adjacent sampling times.

19. The signal processing apparatus of claim 18, wherein the sampling time control means is configured to provide a plurality of digital values, each digital value specifying an offset with respect to a respective sampling time of a predetermined grid of a plurality of points in time.

20. The signal processing apparatus of claim 18, wherein the sampling time control unit is configured to vary a time interval between two subsequent sampling times of the sequence of sampling times over the sequence of sampling times.

* * * * *